(12) United States Patent
Huang et al.

(10) Patent No.: US 9,291,890 B2
(45) Date of Patent: Mar. 22, 2016

(54) METHOD FOR REPAIRING A MASK

(71) Applicant: Taiwan Semiconductor Manufacturing Company, Ltd., Hsin-Chu (TW)

(72) Inventors: Yen-Kai Huang, Hsinchu (TW); Yuan-Chih Chu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 210 days.

(21) Appl. No.: 14/052,189

(22) Filed: Oct. 11, 2013

(65) Prior Publication Data

US 2015/0104732 A1    Apr. 16, 2015

(51) Int. Cl.
*G03F 1/22* (2012.01)
*G03F 1/72* (2012.01)

(52) U.S. Cl.
CPC ... *G03F 1/72* (2013.01); *G03F 1/22* (2013.01)

(58) Field of Classification Search
CPC ..................................... G03F 1/22; G03F 1/72
USPC ............................................................. 430/5
See application file for complete search history.

(56) References Cited

U.S. PATENT DOCUMENTS

| 7,527,901 B2 * | 5/2009 | Lee et al. ........................ 430/5 |
| 8,921,015 B2 * | 12/2014 | Li et al. ........................... 430/5 |
| 2006/0134920 A1 * | 6/2006 | Liang ........................... 438/710 |

OTHER PUBLICATIONS

Yen-Kai Huang, U.S. Appl. No. 13/757,543, filed Feb. 1, 2013, for "Apparatus of Analyzing a Sample and a Method for the Same," 1 pages of text, 4 pages of drawings.

* cited by examiner

*Primary Examiner* — Stephen Rosasco
(74) *Attorney, Agent, or Firm* — Haynes and Boone, LLP (57) ABSTRACT

A method for repairing a mask is disclosed. A mask, having multiple defective regions need to be repaired, is received. Locations and sizes of the defective regions are determined. A pre-repair-passivation-treatment (PRPT) is performed to form a passivation membrane over the mask. With the passivation membrane on the mask, a mask repair process is performed to the defective regions on the mask.

20 Claims, 11 Drawing Sheets

METHOD FOR REPAIRING A MASK

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. In one example associated with lithography patterning, a photomask (or mask) to be used in a lithography process has a circuit pattern defined thereon and is to be transferred to wafers. The pattern on the mask needs to be very accurate and small, which can be adversely effected by any mask defects in the advanced technology nodes. It is desired to provide a high-resolution mask repair process

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
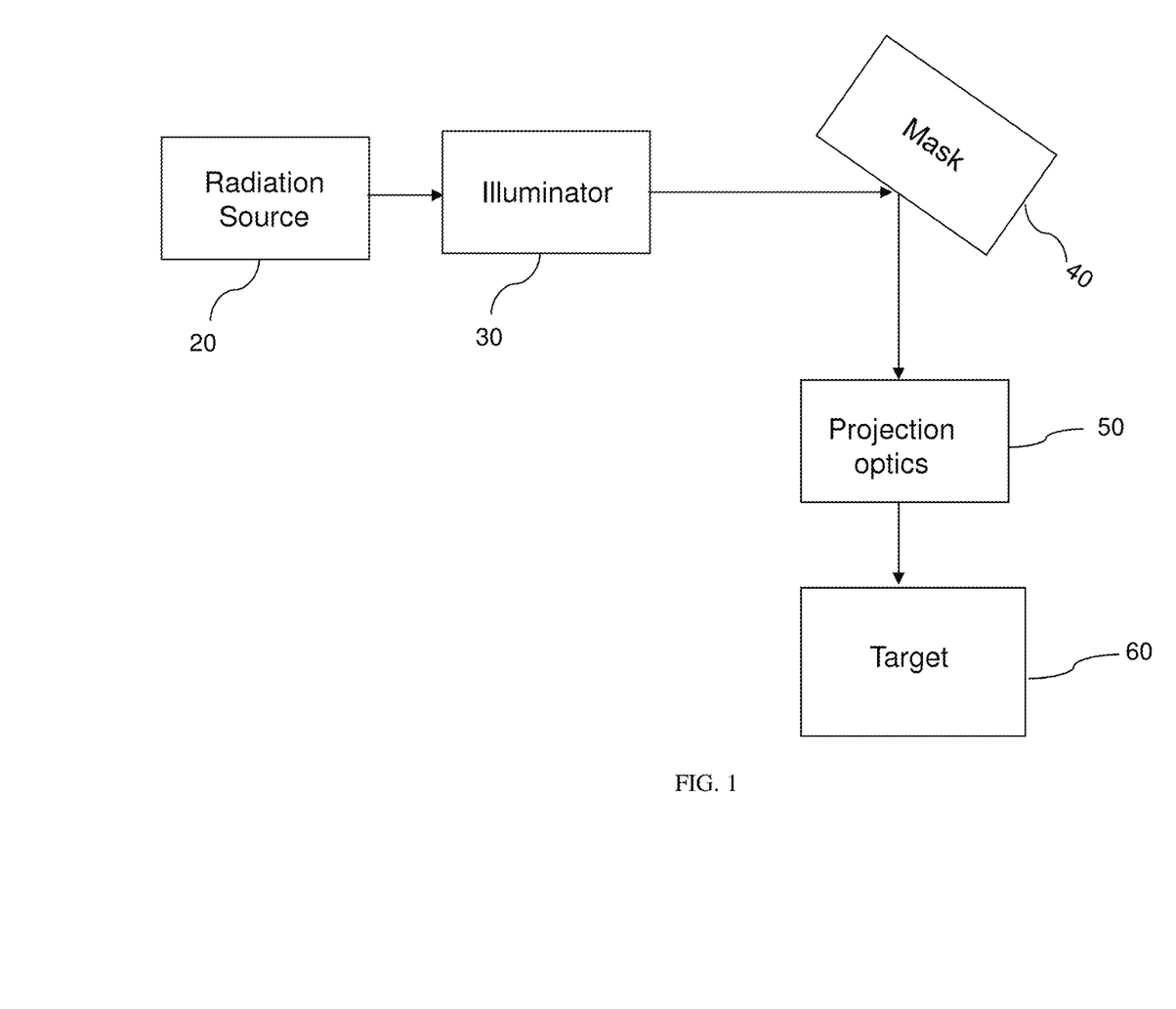
FIG. 1 is a block diagram of a lithography system for implementing one or more embodiments of the present invention.

Referring to FIG. 1, a lithography system 10 that may benefit from one or more embodiments of the present invention is disclosed. The lithography process 10 employs a radiation source 20. The radiation source 20 may be any suitable light source, such as a Krypton Fluoride (KrF) excimer laser, an Argon Fluoride (ArF) excimer laser, a Fluoride (F2) excimer laser, or other light sources having a longer wavelength. The radiation source 20 may include an optical source selected from the group consisting of ultraviolet (UV) source, deep UV (DUV) source, extreme UV (EUV) source, and X-ray source. The radiation source may alternatively include a particle source selected from the group consisting of electron beam (E-Beam) source, ion beam source, and plasma source.

The lithography system 10 also employs an illuminator 30, which may comprise refractive optics such as a single lens or a lens system having multiple lenses, and reflective optics such as mirrors.

The lithography system 10 also employs a mask 40 (in the present disclosure, the terms of mask, photomask, and reticle are used to refer to the same item). The mask 40 can be a transmissive mask or a reflective mask. A transparent mask includes a transparent substrate and a patterned absorption (opaque) layer. A light beam may be partially or completely blocked when directed on an opaque region. The opaque layer may be patterned to have one or more openings through which an incident light may travel through (for a transparent mask) or reflect from a reflective region (for a reflective mask). A reflective mask includes an absorptive region and a reflective region. In the absorption region, a light beam may be partially or completely absorbed by an absorption layer, while in the reflective region, the absorption layer is removed and an incident light is reflected by a reflective multilayer (ML).

The lithography system 10 also employs optics, generally referred to as a projection optics box (POB) 50. The POB 50 may have refractive optics or reflective optics. The radiation reflected from the mask 40 (e.g., a patterned radiation) is collected by the POB 50.

The target 60 includes a semiconductor wafer with a photosensitive layer (referred to as photoresist or resist), which is sensitive to a radiation. The target 60 may be held by a target substrate stage. The target substrate stage provides control of the target substrate position such that the image of the mask is scanned onto the target substrate in a repetitive fashion (though other lithography methods are possible).

The following description refers to the mask 40 and a process for repairing the mask. A formation of a mask may include two steps: forming a mask substrate and patterning the mask substrate. A mask substrate is formed by a stack of layers (e.g., multiple reflective layers). The mask substrate is patterned to have a design pattern for a layer of an integrated circuit (IC) device (or chip). A mask repair process may be implemented before or/and after the mask patterning process to mitigate the printability of defects on the patterned mask. After repairing, the patterned mask is then used to transfer the design pattern onto a semiconductor wafer. The design pattern can be transferred over and over onto multiple wafers through various lithography processes. Several masks (for example, a set of 15 to 30 masks) may be used to construct a complete IC device.

Figure 2A:
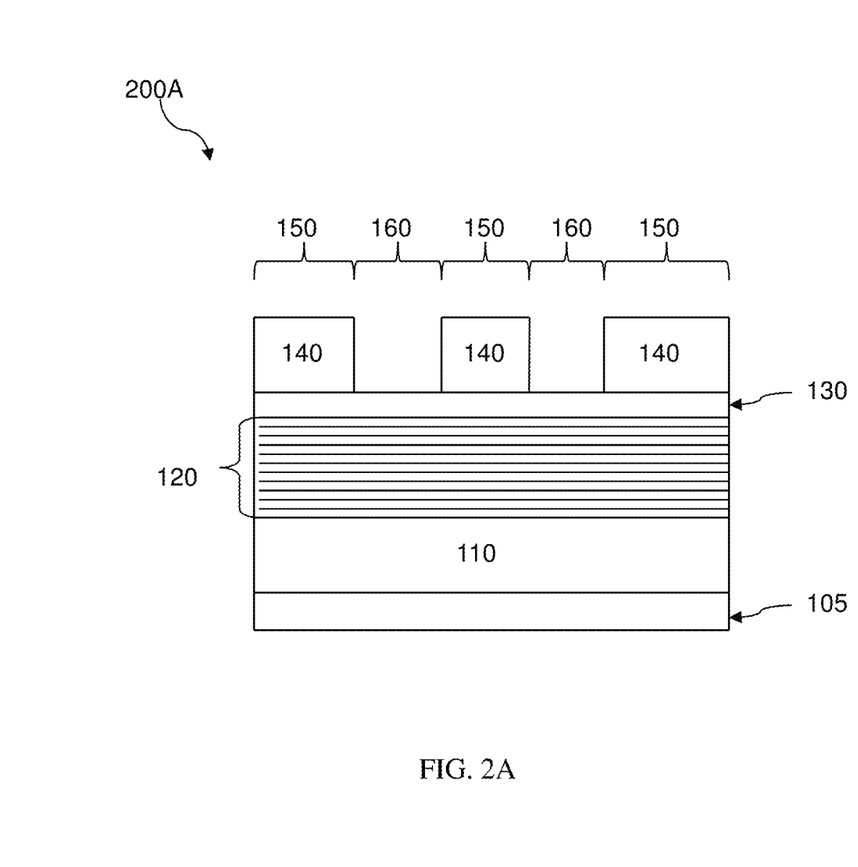
FIGS. 2A and 2B are sectional views of a mask constructed according to various embodiments.
Figure 2B:
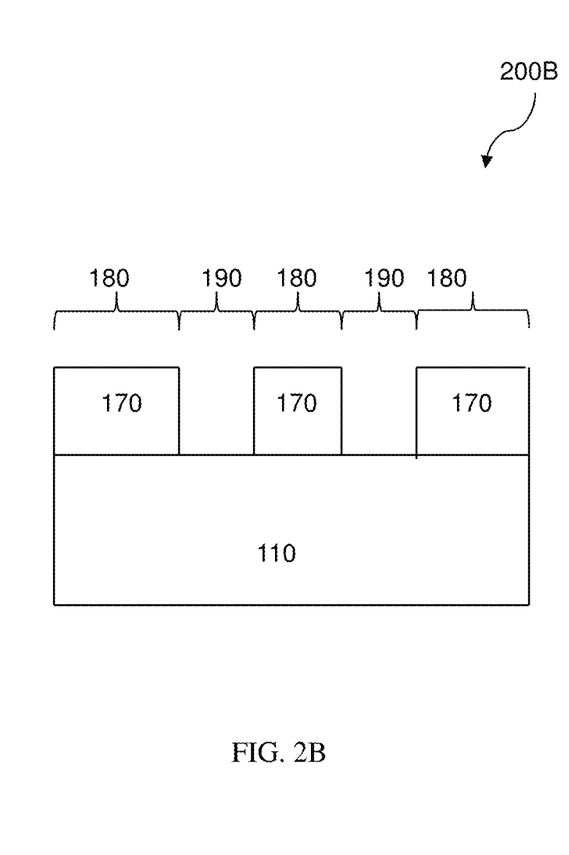

Referring to FIGS. 2A and 2B, a mask substrate includes a material layer 110. The layer 110 may be made of low thermal expansion material (LTEM). As an example, the LTEM may include $TiO_2$, doped $SiO_2$, and/or other low thermal expansion materials known in the art. The LTEM layer 110 serves to minimize image distortion due to mask heating.

Now referring to FIG. 2A, for a reflective mask 200A, a reflective multilayer (ML) 120 is formed over the LTEM layer 110. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any material that is highly reflective at EUV wavelengths can be utilized for the ML 120. A capping layer 130 is formed over the ML 120 to prevent oxidation of the ML 120. The capping layer 130 includes ruthenium (Ru), Ru compounds such as RuB, RuSi, chromium (Cr), Cr oxide, and Cr nitride. An absorption layer 140 is formed over the capping layer 130. The absorption layer 140 includes multiple film layers from a group consisting of tantalum (Ta), tantalum boron nitride (TaBN), tantalum, titanium, or aluminum-copper, palladium, tantalum nitride, aluminum oxide, molybdenum (Mo), or other suitable materials. In addition, a conductive layer 105 may be deposited under (as shown in the figure) the LTEM layer 110 for the electrostatic chucking purpose. In an embodiment, the conductive layer 105 includes chromium nitride (CrN), though other compositions are possible.

One or more of the layers 105, 120, 130 and 140 may be formed by various methods, including physical vapor deposition (PVD) process, a chemical vapor deposition (CVD) process, ion beam deposition, spin-on coating, metal-organic decomposition (MOD), and/or other methods known in the art.

The absorption layer 140 is patterned to form the design layout pattern EUV mask 200A. In some embodiments, the absorption layer 140 is patterned to define two regions, an absorptive region 150 and a reflective region 160. A patterning process may include resist coating (e.g., spin-on coating), exposure, developing the resist, other suitable processes, and/or combinations thereof. Alternatively, the photolithography exposing process is implemented or replaced by other proper methods such as maskless photolithography, electron-beam writing, direct-writing, and/or ion-beam writing. An etching process is performed next to remove portions of the absorption layer 140 to form the reflective region 160. Meanwhile, in the absorptive region 150, the absorption layer 140 remains. The etching process may include dry (plasma) etching, wet etching, and/or other etching methods.

Now referring to FIG. 2B, for a transmissive mask 200B, a patterned absorption (an opaque) layer 170 is formed over the LTEM layer 110. In some embodiments, the patterned absorption layer 170 defines two regions: an absorptive region 180 and a transmissive region 190. The patterned opaque layer 170 includes chromium, chromium oxide, aluminum-copper palladium, tantalum nitride, aluminum oxide titanium, tungsten, and/or combinations thereof. The patterned opaque layer 170 is formed similarly in many respects to the patterned absorption layer 140 discussed above in association with FIG. 2A.

Figure 3:
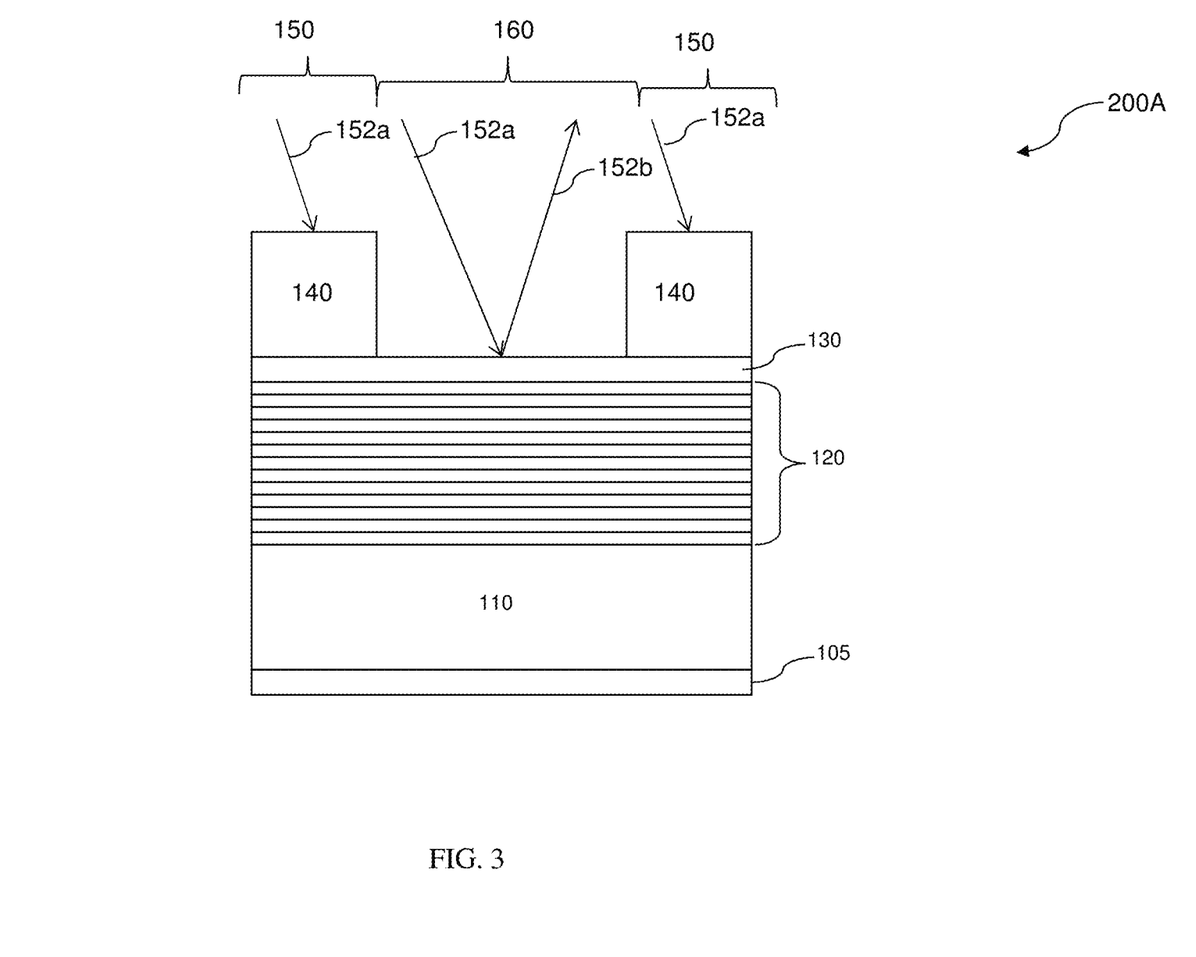
FIG. 3 is cross sectional view of a mask used in a lithography exposing tool that can benefit from one or more embodiments of the present disclosed method.
Figure 4A:
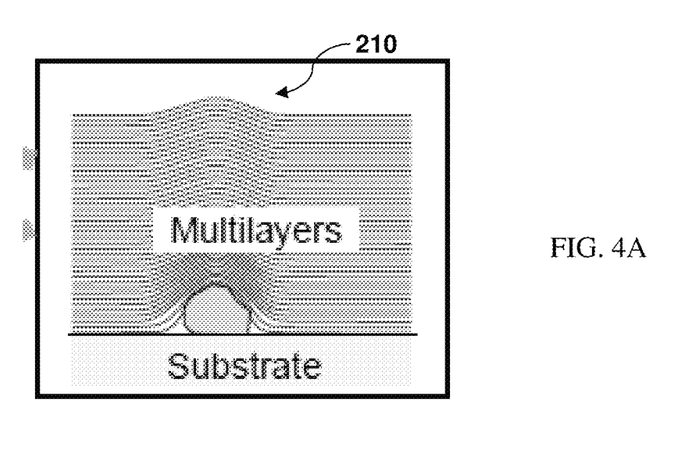
FIGS. 4A and 4B are sectional views of an exemplary defect in a reflective mask constructed according to various embodiments.
Figure 4B:
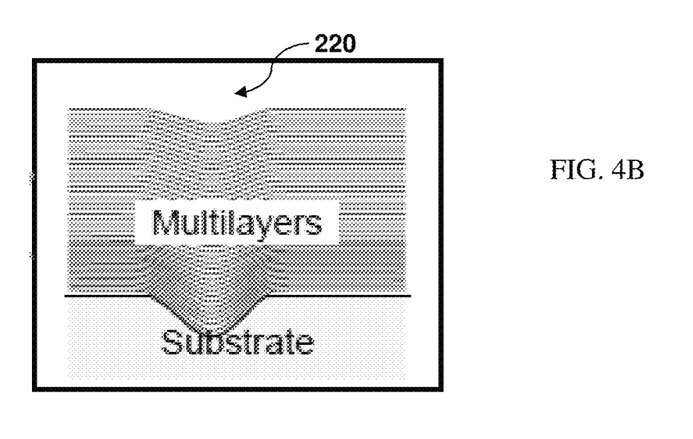

As shown in FIG. 3, when an illumination beam 152a is projected on a mask, such as the reflective mask 200A, a portion of the illumination beam 152a projected on the absorptive region 150 is absorbed by the absorption layer 140 and another portion of the illumination beam 152a projected on the reflective region 155 is reflected by the reflective ML 120. A patterned illumination bean 152b is thereby generated. The patterned illumination beam 152b is used to expose a resist film deposited on a wafer substrate and a resist pattern is formed on the wafer substrate. One challenge in lithography technique occurs when defects appear in/on a mask. For example, referring to FIGS. 4A and 4B, a defect is in a reflective mask according to various examples. In one example, a bump defect 210 is illustrated in FIG. 4A. In another example, a pit defect 220 is illustrated in FIG. 4B. Either the bump defect 210 or the pit defect 220 changes profile of the multilayer surface and therefore distorts the reflected illumination beam from the multilayer surface. For yet another example, defects include a residue of the absorption layer left in the transmissive or the reflective region of a mask. For yet another example, defects include any undesired pattern features in a mask.

Figure 5:
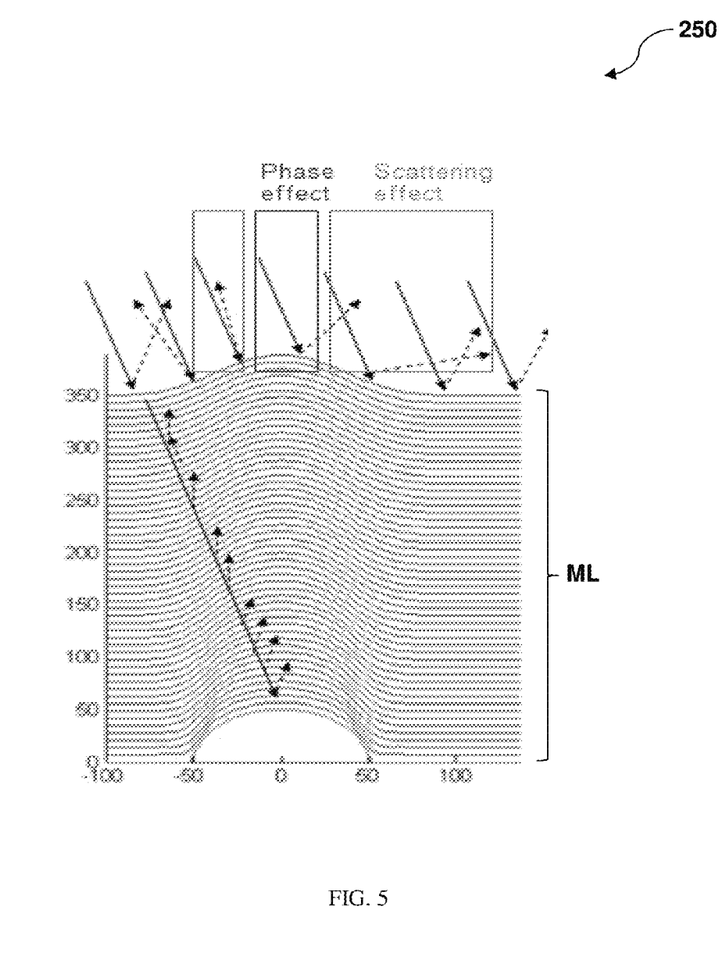
FIG. 5 is illustrates illuminating a reflective mask during a lithography process constructed according to one embodiment.

Referring now to FIG. 5, an example 250 of the illumination beam reflected on the multilayer surface of a reflective mask having a defect is illustrated. The defect includes a bump defect in the multilayer. The incident illumination beam is presented as a solid arrow line and the reflected illumination beam is represented as a dash arrow line. The bump defect creates an irregular surface on the multilayer. The irregular surface may create a plurality of irregular reflected illumination beams because of the phased effect and the scattering effect.

Generally, in lithography process, a mask repair process is usually performed to repair defects or defective regions. Sometimes a width of a repaired defective region may result in an unwanted larger size in a repair process. For example, a lateral etch may cause an unwanted larger size (a poor repair resolution) when an etching process is performed to repair the defects. For another example, a repair process may include focused-electron-beam-induced etching (referred to as e-beam etch) by dispensing a precursor gases in very close vicinity to the incident electron beam to generate a reaction and result in etching. During the e-beam etch, a backscattered or secondary electrons may be generated and scatter back to react with the precursor gases in unwanted region nearby to make a repair region have an undesired wider width. When feature sizes become smaller and smaller, a high-resolution repair process become more and more important. The present disclosure offers a high-resolution mask repair process.

Figure 6:
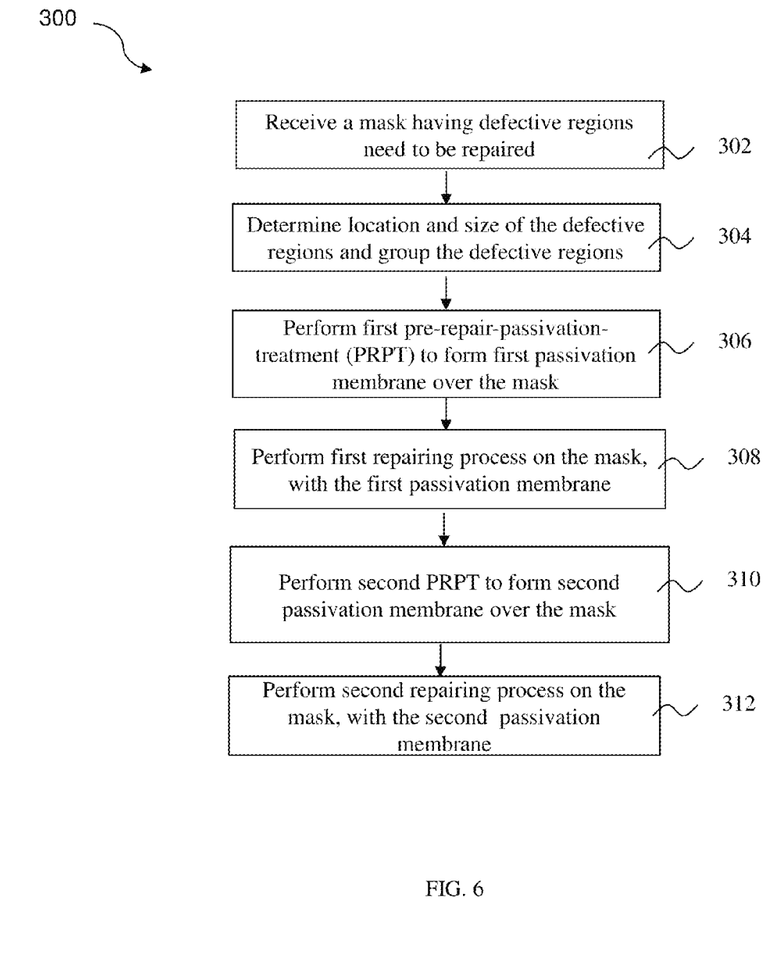
FIG. 6 is a flow chart of a method for repairing a mask according to various aspects of the present disclosure.

FIG. 6 is a flowchart of a method 300 of repairing a mask according to aspects of the present disclosure. FIGS. 7A to 7B, 8A to 8B, 9A to 9B and 10A to 10B are cross-sectional views of embodiments at various stages of the method 300.

Figure 7A:
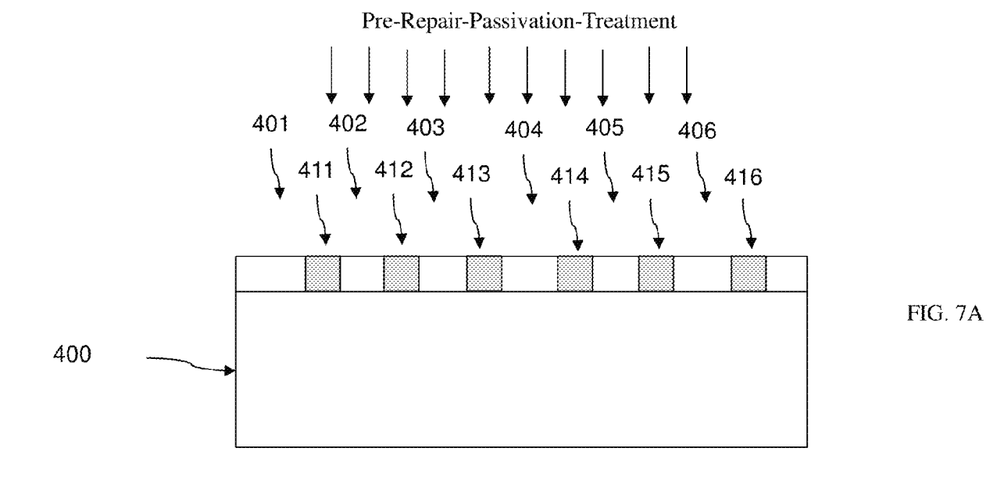
FIGS. 7A to 7B, 8A to 8B, 9A to 9B and 10A to 10B are cross sectional views of one embodiment in various stages for repairing a mask according to various aspects of the present disclosure.
Figure 7B:
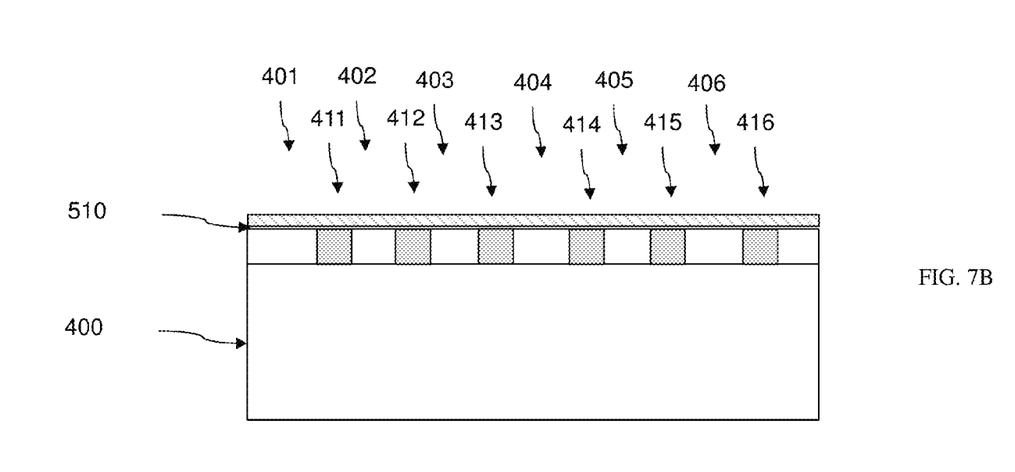

Referring to FIGS. 6 and 7A, the method 300 starts at step 302 by receiving a mask 400 having one or more normal pattern regions, such as 401, 402, . . . , 406 and one or more defective regions, such as 411, 412, . . . , 416, which are needed to be repaired. FIG. 7A has been simplified for the sake of clarity to better illustration of concepts of the present disclosure. The mask 400 includes transmissive and reflective masks. The defective regions (411-416) may caused by any types of defect in/on the mask 400. For example, defective regions (411-416) are formed due to local deformation of all subsequent layers above a bump or a pit locates on the surface of the LTEM layer 110 (beneath the ML 120) or embedded in the ML 120. For another example, defective regions (411-416) may include residues of the absorption layer 140 left in a transmissive (or a reflective) region of the mask 400. For yet another example, defective regions (410-416) may include any undesired pattern features in the mask 400.

Referring also to FIG. 6, the method 300 proceeds to step 304 by determining a location and size of each defect region, such as defective regions 411-416. The location and size of the defective region(s) may be detected by atomic force microscopy (AFM), aerial image metrology system (AIMS™, by Carl Zeiss) or other defect metrology tools. In some embodiments, two-dimensional (2D) information as location and size is obtained. The 2D information is in a plane which is parallel to the surface of the LTEM layer 110. In some embodiments, three-dimensional (3D) profiles of the defective region (411-416) are obtained. In one embodiment, to-be-repaired defective regions are divided into two or more groups, such as a first group includes the defective regions 411, 413, 415 and a second group includes the defective regions 412, 414 and 416. The different groups will be repaired at different repairing steps, which will be described later.

Referring again to FIGS. 6 and 7A-7B, the method 300 proceeds to step 306 by performing a first pre-repair-passivation-treatment (PRPT) (represented in FIG. 7A by down-arrows) to form a first passivation membrane 510 over the mask 400. The first PRPT may include oxygen plasma treatment, a hot air flow treatment, a hot N2 flow treatment, or a wet treatment such as nitric acid ($HNO_3$), hydrogen peroxide ($H_2O_2$) In one embodiment, the oxygen plasma passivation treatment is performed and an oxidation membrane 510 is formed over the mask 400.

Figure 8A:
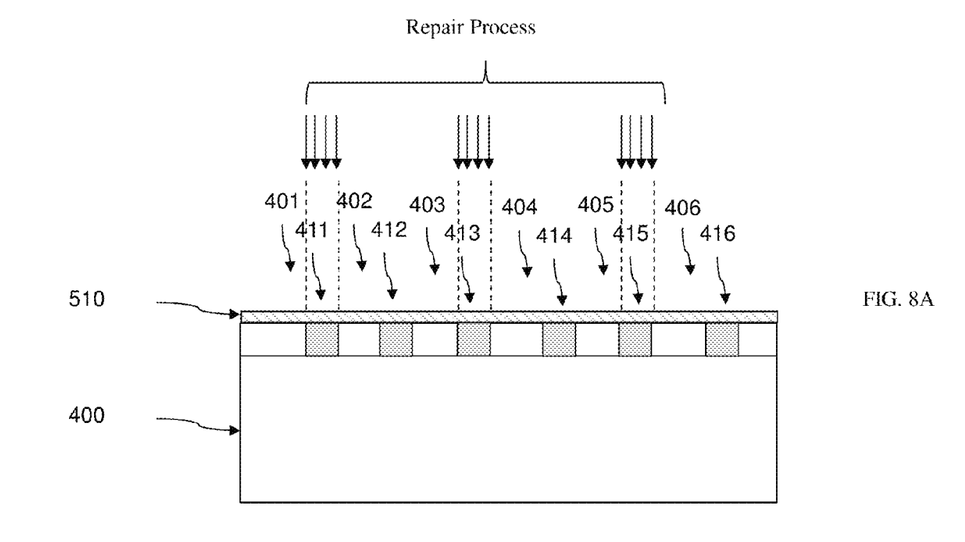
Figure 8B:
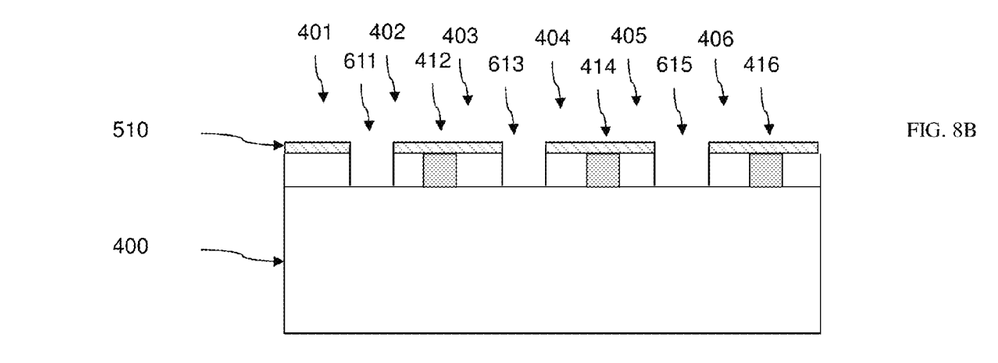

Referring to FIGS. 6 and 8A-8B, after forming the first passivation membrane 510, the method 300 proceeds to step 308 by performing a first repair process on the mask 400. In one embodiment, the first repair process includes an e-beam etching. In the e-beam etching, with the first passivation membrane 510 on the mask 400, a major portion of the backscattered or secondary electrons are blocked to scatter back and thus its reaction with the precursor gases is reduced dramatically. Thus a width of each repaired defective region, such as 611, 613 and 615, is significantly confined to the area exposed by the focused electron beam, which results in a high-resolution repair process.

In some embodiments, a selected group of defective regions is repaired in the first repair process. For example, every other defective region (such as the first group of 411, 413 and 415) is selected and repaired in the first repair process to form a first repaired defective region 611, 613, 615, respectively. In this way, a distance between two adjacent repaired defective regions is larger than a distance between two adjacent defective regions, which may relax constraints for repair process equipment and repair process. Alternatively, all defective regions are repaired in the first repair process.

Figure 9A:
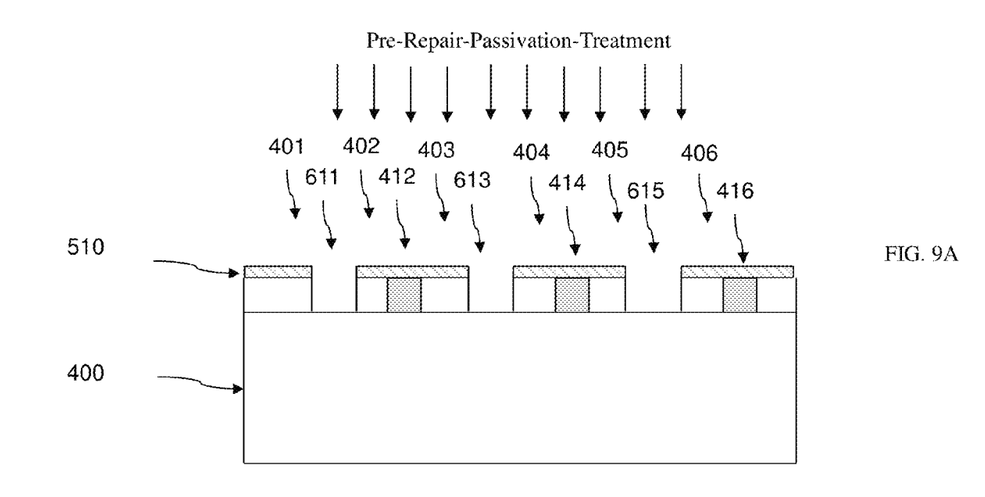
Figure 9B:
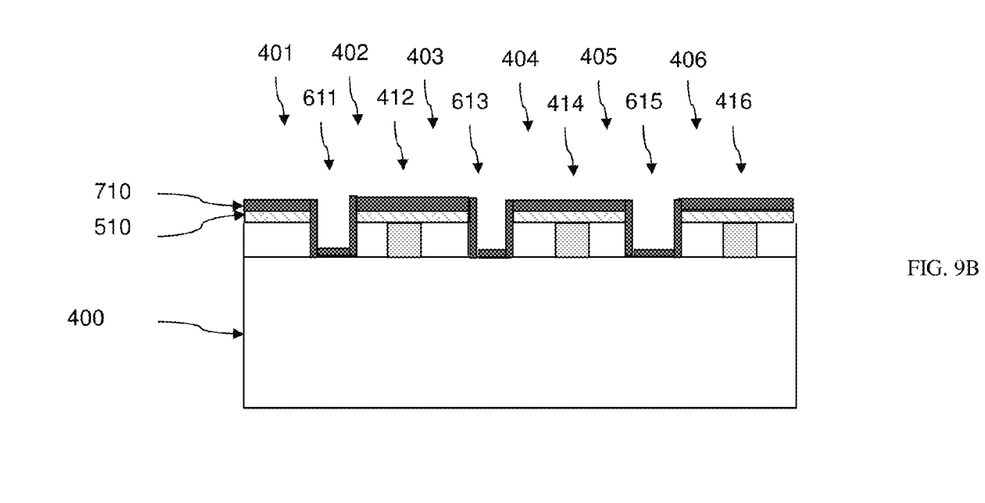

Referring to FIGS. 6 and 9A-9B, the method 300 proceeds to step 310 by performing a second PRPT to form a second passivation membrane 710 over the mask 400. The second PRPT is similar in many respects to the first PRPT discussed above in association with FIGS. 7A-7B. The second passivation membrane 710 is formed over the first passivation membrane 510, as well as the repaired defective regions of 611, 613 and 615, including their sidewalls and bottoms Referring to FIGS. 6 and 10A-10B, after forming the second passivation membrane 710, the method 300 proceeds to step 312 by performing a second repair process on the mask 400. The second repair process is similar in many respects to the first repair process discussed above in association with FIGS. 8A-8B. With the second membrane 710, an unwanted reaction caused by backscattered electrons or secondary electrons reacting with the precursor gases in unwanted region, may be reduced dramatically and a resolution of repair process may be improved.

Figure 10A:
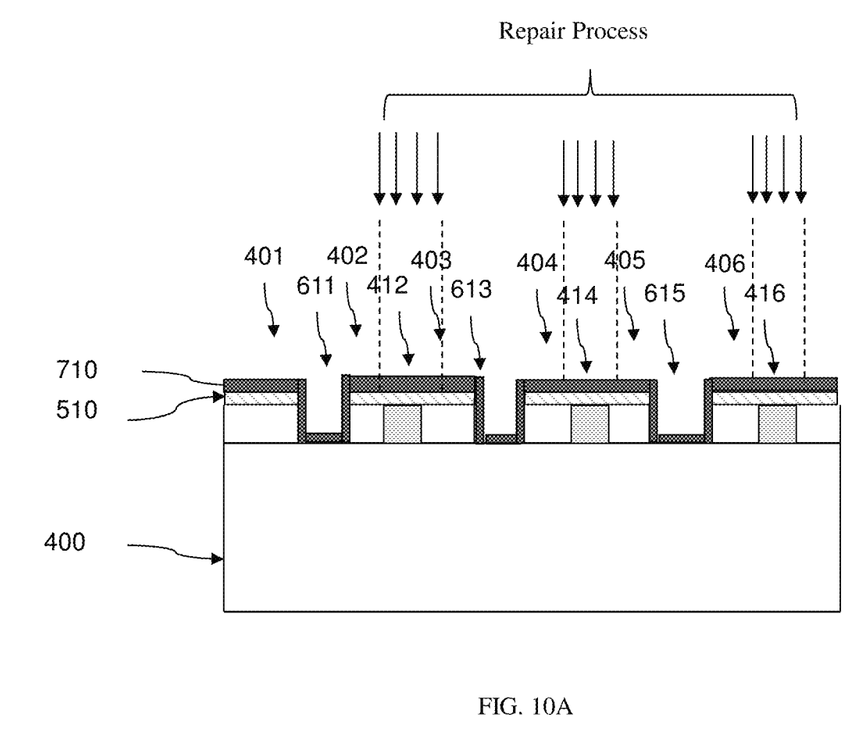
Figure 10B:
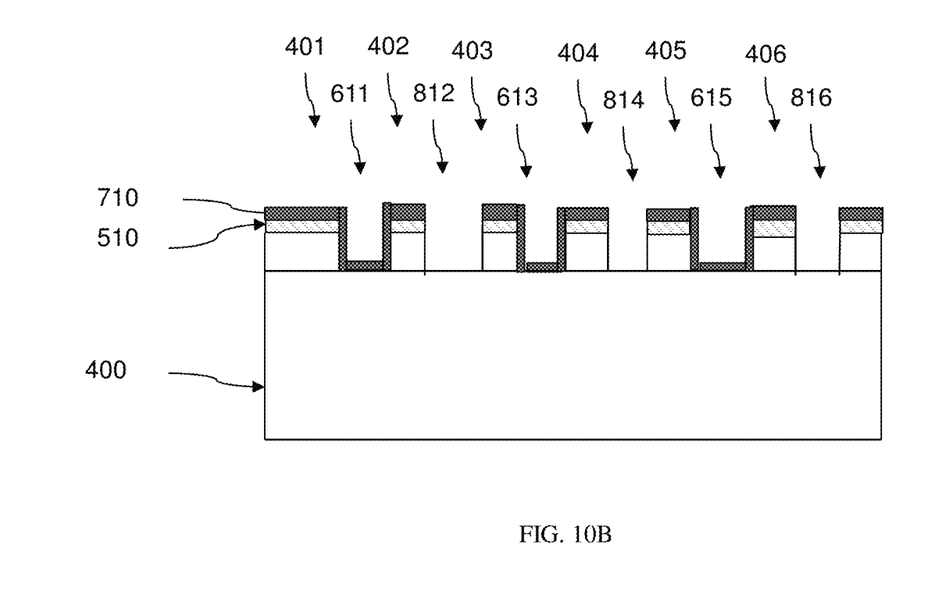

In one embodiment, another selected group of defective regions, such as the second group of 412, 414 and 416, is repaired in the second repair process to form a second group of repaired regions, 812, 814 and 816, respectively. With a larger distance between adjacent defective regions in the second selected group, constrains for repair process equipment and repair process are relaxed. Also, being protected by the second membrane 710, fresh areas of the repaired defective regions of 611, 613 and 615 formed by the first repair process are less adversely affected in the second repair process.

Additional steps can be provided before, during, and after the method 300, and some of the steps described can be replaced or eliminated for other embodiments of the method. Additionally, some steps may be performed concurrently with other steps.

Based on the above, it can be seen that the present disclosure offers a mask repair method. The method employs forming a passivation membrane over a to-be-repaired-mask, by applying a pre-repair-passivation-treatment (PRPT). By using the passivation membrane, a repair-region-width-broaden effect in mask repair process is reduced dramatically. The method provides a high-resolution repair process. Challenges being raised by new lithography techniques are not only in resolution but also in economy (e.g. cost of upgrading and loss of throughput). Economy is often maintained by extending the use of existing lithography tools for advanced technology nodes. The method employs a multiple PRPT and repair process to relax constraints for repair process equipment and repair process and extending the use of existing repair process equipment for advanced technology nodes.

The present disclosure provides a method for repairing a mask. The method includes receiving a mask having defective regions, performing a first pre-repair-passivation-treatment (PRPT) to form a first passivation membrane over the mask, performing a first repair process with the first passivation membrane over the mask. A first group of pre-selected defective regions are repaired and form a first repaired defective region. The method also includes performing a second PRPT to form a second passivation membrane over the mask, including the first repaired defective region and performing a second repair process with the second passivation membrane. A second group of pre-selected defective regions are repaired.

In another embodiment, a method for repairing an extreme ultraviolet (EUV) mask includes receiving an EUV mask having multiple defective regions, which is to be repaired. The method also includes determining a location and a size of the defective regions, grouping defective regions into different groups, performing a first pre-repair-passivation-treatment (PRPT) to form a first passivation membrane over the EUV mask. The method also includes, with the first passivation membrane over the EUV mask, repairing a first group of pre-elective defective region by a gas-assisted focused-electron-beam technique to form a first repaired defective region.

The method also includes performing a second PRPT to form a second passivation membrane over the EUV mask, including the first repaired defective region and with the second passivation membrane, repairing a second group of pre-elective defective region by a gas-assisted focused-electron-beam technique to form a second repaired defective region.

In yet another embodiment, a method for repairing an extreme ultraviolet (EUV) mask includes receiving an EUV mask having at least one defective region, which is to be repaired, determining a location and a size of the defect, performing a pre-repair-passivation-treatment (PRPT) to form a passivation membrane over the EUV mask and repairing defective region by a gas-assisted focused-electron-beam technique with the passivation membrane.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for repairing a mask, comprising:
    receiving a mask having first and second defective regions;
    performing a first pre-repair-passivation-treatment (PRPT) to form a first passivation membrane over the mask;
    after forming the first passivation membrane, performing a first repair process on the mask, wherein the first defective region is repaired to form a first repaired defective region;
    performing a second PRPT to form a second passivation membrane over the mask, including the first repaired defective region; and
    after forming the second passivation membrane, performing a second repair process on the mask, wherein the second defective region is repaired to form a second repaired defective region.

2. The method of claim 1, wherein the first and second passivation membranes are formed by performing an oxygen plasma treatment on the mask.

3. The method of claim 1, wherein the first and second passivation membranes are formed by performing a hot air flow treatment on the mask.

4. The method of claim 1, wherein the first and second passivation membranes are formed by performing a hot nitrogen flow treatment on the mask.

5. The method of claim 1, wherein the first and second passivation membranes are formed by performing a nitric acid wet treatment on the mask.

6. The method of claim 1, wherein the defective regions are repaired by a gas-assisted focused-electron-beam-induced etching process.

7. The method of claim 1, wherein the second passivation membrane is formed over a sidewall and a bottom of the first repaired defective region.

8. The method of claim 1, further comprising:
    determining a location and a size of each of the first and second defective regions before performing the first PRPT; and
    grouping a first set of defects and a second set of defects into the first defective region and the second defective region respectively.

9. The method of claim 1, wherein the mask has a plurality of defects, and wherein the second defective region includes a defect between two defects in the first defective region.

10. The method of claim 9, wherein the first defective region includes a defect between two defects in the second defective region.

11. A method for repairing an extreme ultraviolet (EUV) mask, comprising:
    receiving an EUV mask having multiple defective regions;
    determining a location and a size of each of the defective regions;
    grouping the defective regions into different groups;
    performing a first pre-repair-passivation-treatment (PRPT) to form a first passivation membrane over the EUV mask;
    after forming the first passivation membrane, repairing a first group of defective regions by a gas-assisted focused-electron-beam technique to form a first group of repaired defective regions;
    performing a second PRPT to form a second passivation membrane over the EUV mask, including the first group of repaired defective regions; and
    after forming the second passivation membrane, repairing a second group of defective regions by a gas-assisted focused-electron-beam technique to form a second group of repaired defective regions.

12. The method of claim 11, wherein the first and second passivation membranes are formed by performing an oxygen plasma treatment on the EUV mask.

13. The method of claim 11, wherein the first and second passivation membranes are formed by performing a hot air flow treatment on the EUV mask.

14. The method of claim 11, wherein the first and second passivation membranes are formed by performing a hot nitrogen flow treatment on the EUV mask.

15. The method of claim 11, wherein the first and second passivation membranes are formed by performing a nitric acid wet treatment on the EUV mask.

16. The method of claim 11, wherein the second passivation membrane is formed over a sidewall and bottom of the first repaired defective region.

17. The method of claim 11, wherein a defective region in the first group of the defective regions is between two defective regions in the second group of the defective regions.

18. The method of claim 17, wherein a defective region in the second group of defective regions is between two defective regions in the first group of defective regions.

19. A method for repairing an extreme ultraviolet (EUV) mask, comprising:
    receiving an EUV mask having multiple defects including a first defect and a second defect;
    determining a location and a size of each of the defects;
    performing a first pre-repair-passivation-treatment (PRPT) to form a first passivation membrane over the EUV mask;
    after forming the first passivation membrane, repairing the first defect by a gas-assisted focused-electron-beam technique
    performing a second PRPT to form a second passivation membrane over the EUV mask, including a region including the repaired first defect; and
    after forming the second passivation membrane, repairing the second defect by the gas-assisted focused-electron-beam technique.

20. The method of claim 19, wherein the first and second passivation membranes are formed by performing an oxygen plasma treatment on the EUV mask.

* * * * *